(12) United States Patent
Degani et al.

(10) Patent No.: US 6,282,100 B1
(45) Date of Patent: Aug. 28, 2001

(54) LOW COST BALL GRID ARRAY PACKAGE

(75) Inventors: Yinon Degani, Highland Park; Thomas Dixon Dudderar, Chatham; Robert Charles Frye, Piscataway, all of NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/346,100

(22) Filed: Jul. 1, 1999

(51) Int. Cl.⁷ .................................................. H05K 1/18
(52) U.S. Cl. .................... 361/760; 361/767; 361/768; 174/250; 174/260
(58) Field of Search .................. 361/760, 765, 361/767, 768, 772, 783; 174/250, 255, 256, 260, 261, 262; 257/734, 736, 737, 738; 228/180.22, 180.5

(56) References Cited

U.S. PATENT DOCUMENTS

| | | | |
|---|---|---|---|
| 4,074,342 | * 2/1978 | Honn et al. | 361/779 |
| 5,258,648 | * 11/1993 | Lin | 257/778 |
| 5,319,243 | * 6/1994 | Leicht et al. | 257/692 |
| 5,477,933 | * 12/1995 | Nguyen | 174/262 |
| 5,515,241 | * 5/1996 | Werther | 361/784 |
| 5,615,089 | * 3/1997 | Yoneda et al. | 361/764 |
| 5,872,700 | * 2/1999 | Collander | 361/760 |
| 5,886,876 | * 3/1999 | Yamaguchi | 361/767 |
| 5,905,639 | * 5/1999 | Warren | 361/776 |
| 6,011,694 | * 1/2000 | Hirakawa | 361/774 |

* cited by examiner

*Primary Examiner*—Jayprakash N. Gandhi
*Assistant Examiner*—David Foster
(74) *Attorney, Agent, or Firm*—Peter V. D. Wilde; Thomas, Kayden, Horstemeyer & Risley

(57) ABSTRACT

The specification describes a high density I/O IC package in which the IC chip is bonded to a silicon intermediate interconnection substrate (IIS), and the IIS is wire bonded to a printed wiring board. This marriage of wire bond technology with high density I/O IC chips results in a low cost, high reliability, state of the art IC package.

9 Claims, 2 Drawing Sheets

US 6,282,100 B1

LOW COST BALL GRID ARRAY PACKAGE

FIELD OF THE INVENTION

This invention relates to ball grid array packages with high density interconnections.

BACKGROUND OF THE INVENTION

Wire bonding has been used in integrated circuit packaging since the inception of IC technology. Wire bonding techniques and wire bonding machines have been refined to the point where wire bonds are relatively inexpensive and are highly reliable. However, wire bonds are rapidly being replaced by more advanced packaging approaches, partly because wire bonds require greater pitch than is available in many state of the art packages.

Among the advanced IC packaging approaches is silicon on silicon technology. Use of silicon interconnection substrates is becoming attractive for high density packages wherein high pin count IC chips are flip chip bonded to a silicon intermediate interconnect substrate, and the silicon intermediate interconnect substrate is in turn ball bonded or flip-chip bonded to a printed wiring board. In many cases these packages use recessed chip arrangements to reduce the package profile.

In these advanced packaging approaches, interconnection pitches can be very small. The earlier technology of wire bonding has been left behind since the high density of I/O's in current IC chips presents a challenge to the capacity of wire bond techniques. However, largely due to the high I/O density of state of the art IC chips, packaging yield using advanced packaging techniques may suffer, and the complexity of the packaging process is increased. As a result the overall cost per bond may be relatively high. The low cost and high reliability of wire bonds makes them attractive if ways can be found to adapt wire bonding to packaging high density I/O chips.

STATEMENT OF THE INVENTION

We have developed an interconnection approach that utilizes wire bonding with high density I/O chips. A typical high density I/O IC chip has an area array of I/O sites that are not easily adapted for wire bonding but can be flip-chip bonded to a silicon intermediate interconnect substrate (IIS) with high reliability and exceptional thermomechanical matching. The silicon IIS is made larger than the silicon IC chip. The high density I/O pattern interconnecting the IC chip and the IIS is fanned out on the silicon IIS to perimeter sites that are then wire bonded to the next board level. This approach marries, in a simple and efficient way, the low cost and high reliability of wire bonds with the high density I/O patterns of state of the art IC chips.

In the preferred embodiment of the invention the fan out layer on the silicon IIS has bare runners, i.e. the conventional polyimide layer is eliminated.

DETAILED DESCRIPTION

State of the art IC chips are now produced with I/O counts that exceed 400. When the number of required interconnections required is this large, and are arranged in an area array, wire bond interconnections are difficult if not impractical. Conventional wire bond interconnection techniques, while inexpensive and reliable, cannot meet the challenge of interconnecting these IC arrays of dense interconnections, so the art typically resorts to more advanced and more expensive techniques.

Figure 1:
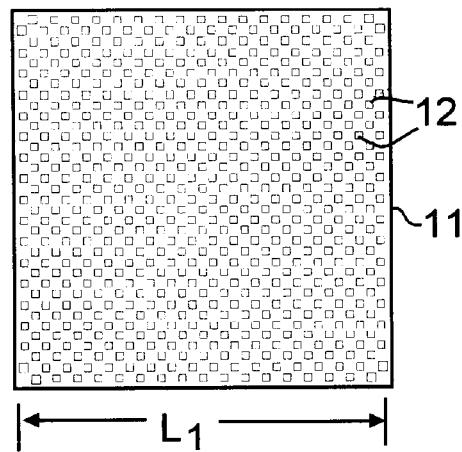
FIG. 1 is a plan view of a high density I/O integrated circuit chip.

An IC chip with a large area array of interconnection sites is shown in FIG. 1. The IC chip is designated 11, and the area array interconnections sites are designated 12. The length of the area array, which is approximately the length of the chip, is designated $L_1$. The interconnection sites are shown as square but can be round. In the IC chip design of FIG. 1, there are 233 interconnection sites, which is fewer than normal for clarity in illustration. In state of the art IC chips, the combined number of I/O interconnections may be much larger, e.g. greater than 400, which more closely represents the interconnection challenge that is addressed by this invention. The effective pitch of these I/O interconnections, i.e. the spacing between interconnections (pads, runners), at the chip edge, may be in the range 20–40 $\mu$m, i.e. less than the pitch of typical wire bonded arrays.

The area array shown in FIG. 1 has a symmetrical array of interconnection sites filling the entire chip area. Other arrangements are equally adapted to the invention. The term area array is generally used to distinguish from edge arrays or perimeter arrays, and is defined as having interconnection sites in the area of the chip removed from the edge, e.g. at least one pitch length interior of any edge interconnection site. This definition, and this invention, includes chips with two rows of interconnection sites located around the edge of the chip. Also, in principle, the invention applies to any configuration which can be flip-chip bonded, including in some cases IC chips with edge arrays.

The essence of flip-chip assembly is the attachment of semiconductor IC substrates "upside down" on an interconnection substrate such as a silicon wafer, ceramic substrate, or printed circuit board. The attachment means is typically solder, in the form of balls, pads, or bumps (generically referred to hereinafter as bumps). Solder bumps may be applied to the semiconductor chip, or to the interconnection substrate, or to both. In the bonding operation, the chip is placed in contact with the substrate and the solder is heated to reflow the solder and attach the chip to the substrate. For successful bonding, it is necessary that the sites to which the solder is bonded it wettable by the solder.

The metal interconnection pattern typically used for integrated circuits and printed wiring boards is aluminum. While techniques for soldering directly to aluminum have been tried it is well known and accepted that aluminum is not a desirable material to solder. Consequently the practice in the industry is to apply a metal coating on the aluminum contact pads, and apply the solder bump or pad to the coating. The metal coating is typically referred to as Under Bump Metallization (UBM).

The metal or metals used in UBM technology must adhere well to aluminum, be wettable by typical tin solder formulations, and be highly conductive. A structure meeting these requirements is a composite of chromium and copper. Chromium is deposited first, to adhere to the aluminum, and copper is applied over the chromium to provide a solder wettable surface. Chromium is known to adhere well to a variety of materials, organic as well as inorganic. However, solder alloys dissolve copper and de-wet from chromium. Therefore, a thin layer of copper directly on chromium will dissolve into the molten solder and then the solder will de-wet from the chromium layer. To insure interface integrity between the solder and the UBM, a composite or alloy layer of chromium and copper is typically used between the chromium and copper layers.

As used herein, the term interconnection site is intended to refer to sites that are ball or bump bonded to another substrate and is used to distinguish from bonding pads that are wire bonded. As described above the interconnection sites generally are provided with under bump metallization. Typically the bonding pads are simple aluminum pads.

The improved interconnection approach, according to the invention, is to use a silicon IIS for the second interconnect level, i.e. the substrate to which the IC chip is flip-chip bonded. A typical IIS following this approach is shown at 15 in FIG. 2. Here the IC chip 11 is shown flip-chip mounted on the IIS 15. The IC interconnection sites 12 of FIG. 1 are mated to IIS interconnection sites (not visible) on the IIS. An array of wire bonding pads 16 is provided along the outer edges of the IIS 15. These wire bonding pads are connected to the IIS interconnection sites via runners 17. The number of bonding pads may or may not match the number of IC interconnection sites. The pitch of the sites on the outer array is preferably greater than 40 $\mu$m, e.g. approximately 50 $\mu$m, to allow for wire bonding these sites to another level. The length of the array is designated $L_2$ in the figure.

Figure 2:
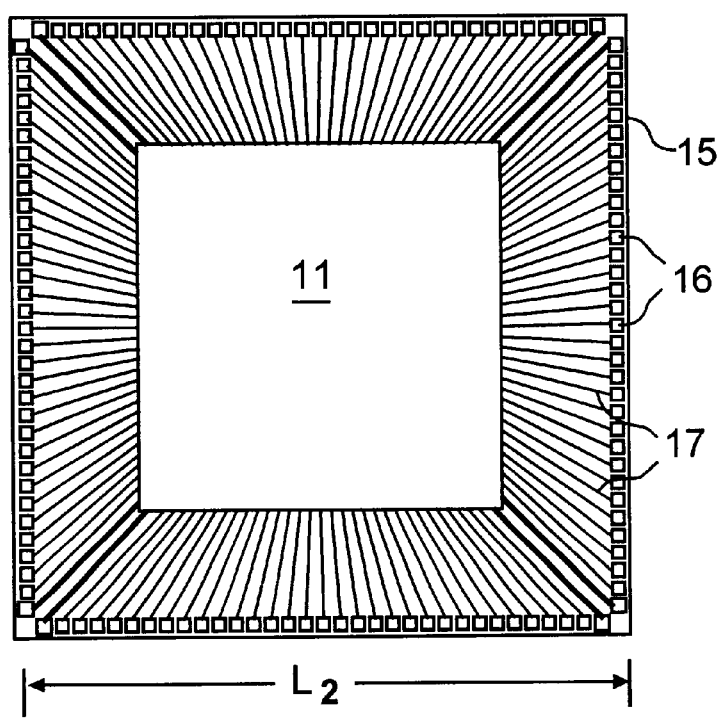
FIG. 2 is a plan view of the IIS of the invention.
Figure 3:
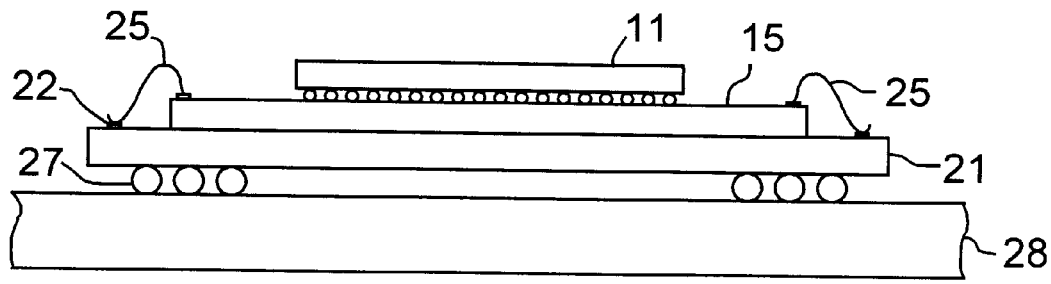
FIG. 3 is a section view of a completed package with the IIS of FIG. 2.

FIG. 3 shows IC chip 11 of FIG. 1 and IIS 15 of FIG. 2 assembled together and mounted on a printed wiring board 21. The IIS is preferably die bonded to the printed wiring board. Interconnections between the array 16 of IIS 15 and an array of bonding pads 22 on the printed wiring board are made with wire bonds 25. The bonding pads are typically copper pads plated with nickel and gold, and the wire bonds are typically made with gold wires.

The printed wiring board 21 is shown in FIG. 3 ball bonded via solder balls 27 to a system printed wiring board 28. The package of FIG. 3 will be recognized by those skilled in the art as a ball grid array (BGA) package but with the unusual features that the chip is mounted on a silicon IIS, and the silicon IIS is wire bonded to the BGA board.

Figure 4:
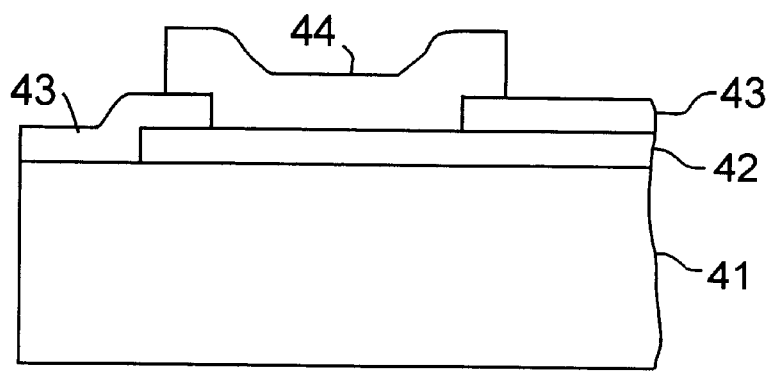
FIG. 4 is a section view of a conventional coated IIS with under bump metallization.
Figure 5:
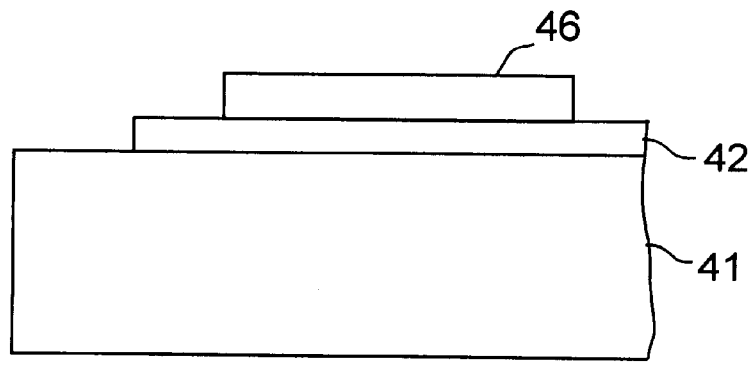
FIG. 5 is a similar view of a simplified IIS according to the invention.

Use of wire bonding between the IIS and the next board level simplifies the processing of the IIS. In a prior art silicon on silicon package, where the IIS is ball or bump bonded to the next level, the IIS is provided with a polyimide layer. Also the array of bonding pads 16 in the prior art arrangement are interconnection sites that are provided with UBM. The polyimide layer requires patterning to accommodate the under bump metallization. This is illustrated in FIG. 4, with the edge portion of the IIS shown at 41, the conductive runner (e.g. 17 of FIG. 2) at 42, the patterned polyimide layer at 43, and the under bump metallization at 44. The simplified structure according to the invention is shown in FIG. 5, where the terminal end of runner 42 simply has an aluminum bonding pad 46. In this simplified process the UBM on the interconnection sites under the IC chip may be formed without using a polyimide layer.

The interconnection between the board level 21 and the system board level is preferably a ball grid array which provides reliable bonding from board 21 to the next board level. However, other interconnection arrangements may be used at these levels. The form of BGA package shown in the figure is but one of many BGA alternatives used in the industry. Any suitable interconnection arrangement can be used to interconnect the IIS assembly to another interconnect level. It will be noted that the solder balls interconnecting board 21 to board 28 are substantially larger than those interconnecting the IC chip to the IIS. The IC chip interconnections are flip-chip micro-joints as described above while the BGA balls are typically 10 to 30 mils in diameter.

In the structures illustrated herein the IC and the IIS are square in shape, however, any quadrangular-shaped chip can be packaged using the approaches described.

It will be noted that the IIS that forms a part of the invention is die bonded to the next board level. The die bond is typically an epoxy bond. According to the main embodiment of the invention the die bond precludes solder ball or solder bump interconnections between the IIS and the next board level. The term die bond, as used herein and in the appended claims can be taken to exclude the presence of direct interconnection across the interface between the IIS and the next board level, other than the possibility of a single power or ground plane interconnection.

The term printed wiring board when used to define the invention refers to standard epoxy boards, for example FR4, ball grid array interconnect substrates, and any other suitable interconnect substrate. Also for the purpose of definition, the term metallization runner is used herein to define a conventional planar metal interconnection between interconnection sites or bonding pads on a chip or interconnection substrate. Typically these runners are aluminum.

The material of the IIS is semiconductor, to match the coefficient of thermal expansion (CTE) of the IC chip. Most typically this will be silicon. An advantage of using silicon is that it can be sufficiently conductive to serve as the bottom conductor level. Another advantage of using silicon is that the metallization technology for forming fine patterns of runners on the silicon is well known and is used in making the IC chip itself. However, lightwave devices, based on e.g. InP, can be packaged using a III–V IIS.

As noted earlier, the invention primarily addresses IC packages wherein the IC has more than 400 I/Os. Also as noted earlier the size of the IIS should be substantially larger than the IC to accommodate the larger array of interconnections at the edge of the IIS. In a typical package made according to the invention the perimeter of the IIS will exceed the perimeter of the IC by at least 15%, and preferably 40% or more. In terms of the area of the IIS relative to the area of the IC chip, the IIS area will in most cases exceed the IC chip area by a factor of at least 1.3, and more preferably 2.0 or more.

Various additional modifications of this invention will occur to those skilled in the art. All deviations from the specific teachings of this specification that basically rely on the principles and their equivalents through which the art has been advanced are properly considered within the scope of the invention as described and claimed.

We claim:
1. An IC package comprising:
 a. a first printed wiring board (first PWB) having an upper surface and a lower surface, and an array of first PWB wire bonding pads on said upper surface,
 b. a semiconductor intermediate interconnection substrate (IIS) comprising:
  i. a semiconductor substrate having an upper surface, a lower planar surface, and a center region on said upper surface,
  ii. an array of IIS interconnection sites in said center region of said upper surface,
  iii. an array of IIS wire bonding pads surrounding said center region of said upper surface, iv. metallization runners interconnecting said array of IIS interconnection sites to said array of IIS wire bonding pads, c. means for die bonding said lower planar surface of said IIS to the upper surface of said first PWB, d. a single silicon IC chip attached to said IIS and having an array of IC chip interconnection sites on a surface thereof, said array of IC chip interconnection sites bonded to said array of IIS interconnection sites, and e. means for wire bonding said array of IIS wire bonding pads to said array of first PWB wire bonding pads.

2. The IC package of claim 1 wherein the said substrate is silicon.

3. The IC package of claim 2 wherein the surface of the IIS is bare except for said metallization runners, said array of IIS wire bonding pads, and said array of IIS interconnection sites.

4. The IC package of claim 1 further including a second printed wiring board (second PWB), an array of second PWB interconnection sites on said second PWB, an array of first PWB interconnection sites on the lower surface of said first PWB, and interconnecting means for interconnecting said array of second PWB interconnection sites with said array of first PWB interconnection sites.

5. The IC package of claim 4 wherein said interconnecting means comprises a ball grid array.

6. The IC package of claim 5 wherein the number of IC interconnection sites is greater than 400.

7. An IC package comprising:
a. a first printed wiring board (first PWB) having an upper surface and a lower surface, and an array of first PWB wire bonding pads on said upper surface,
b. a silicon intermediate interconnection substrate (IIS) comprising:
i. a quadrangular silicon substrate having an upper surface, a lower planar surface, a center region, a perimeter P, and an area A,
ii. an array of IIS interconnection sites in said center region of said upper surface, said array of IIS interconnection sites having an equivalent perimeter pitch $D_1$,
iii. an array of IIS wire bonding pads around said perimeter P, said array of IIS wire bonding pads having a pitch $D_2$, where $D_2$ is at least 1.15 $D_1$,
iv. metallization runners interconnecting said array of IIS interconnection sites to said array of IIS wire bonding pads, c. means for die bonding said lower planar surface of said IIS to the upper surface of said first PWB, d. means for wire bonding said array of IIS wire bonding pads to said array of first PWB wire bonding pads, e. a second printed wiring board (second PWB), an array of second PWB interconnection sites on said second PWB, an array of first PWB interconnection sites on the lower surface of said first PWB, interconnecting means for interconnecting said array of second PWB interconnection sites with said array of first PWB interconnection sites, and f. a single silicon IC chip attached to said IIS and having an area $A_2$, where $A_1$ is at least twice $A_2$, said single silicon IC chip having an array of IC chip interconnection sites on a surface thereof, said array of IC chip interconnection sites bonded to said array of IIS interconnection sites.

8. The IC package of claim 6 wherein the surface of the IIS is bare except for said metallization runners, said array of IIS wire bonding pads and said array of IIS interconnection sites.

9. The IC package of claim 6 wherein said array of IC chip interconnection sites is an area array.

* * * * *